US005673275A

United States Patent [19]
Garcia et al.

[11] Patent Number: 5,673,275
[45] Date of Patent: Sep. 30, 1997

[54] ACCELERATED MODE TESTER TIMING

[75] Inventors: Rodolfo F. Garcia, San Jose; Egbert Graeve, Los Altos, both of Calif.

[73] Assignee: Schlumberger Technology, Inc., San Jose, Calif.

[21] Appl. No.: 696,346

[22] Filed: Aug. 13, 1996

Related U.S. Application Data

[63] Continuation of Ser. No. 526,889, Sep. 12, 1995, abandoned.
[51] Int. Cl.[6] .................................................. G06F 11/00
[52] U.S. Cl. .......................................................... 371/22.1
[58] Field of Search ................................. 371/22.1, 22.2, 371/22.6, 27; 324/158 R; 345/750

[56] References Cited

U.S. PATENT DOCUMENTS

| | | | |
|---|---|---|---|
| 4,339,819 | 7/1982 | Jacobson | 371/16 |
| 4,365,312 | 12/1982 | Nakano et al. | 364/900 |
| 4,450,560 | 5/1984 | Conner | 371/25 |
| 4,502,127 | 2/1985 | Garcia et al. | 364/900 |
| 5,212,443 | 5/1993 | West et al. | 324/158 |
| 5,461,310 | 10/1995 | Cheung et al. | 324/158.1 |
| 5,477,139 | 12/1995 | West et al. | 324/158.1 |
| 5,481,550 | 1/1996 | Garcia et al. | 371/127 |

OTHER PUBLICATIONS

Stepleton, J.M., "A New System Architecture for a Combined In–Circuit/Functional Tester," *International Test Conference* Paper 34.1:763–772 (1989).

Barton, S., "Characterization of High–Speed (Above 500 MHz) Devices Using Advanced ATE –Techniques, Results and Device Problems," *International Test Conference* Paper 37.3:860–868 (1989).

*Primary Examiner*—Vincent P. Canney
*Attorney, Agent, or Firm*—Fish & Richardson P.C.

[57] ABSTRACT

A test system, for testing circuits, having two operating modes, a normal mode and an accelerated mode. The test system has a first start memory, a second start memory, a first sequence memory, and a second sequence memory. The start memories provide sequence memory addresses for addressing the sequence memories, and the sequence memories provide event sequences in response to sequence memory addresses. If operating in normal mode, the start memories are electronically coupled (switched) to provide a single sequence memory address to both sequence memories. If operating in accelerated mode, the start memories are electronically coupled so that the first start memory provides a first sequence memory address to the first sequence memory and the second start memory provides an independent second sequence memory address to the second sequence memory. In particular embodiments, the first and second start memories are of the same size, the first and second sequence memories are of the same size, and the sequence memories produce a word including at least two events in response to a sequence memory address. In a further embodiment, the test system has three operating modes: normal, accelerated, and double-accelerated. For the double-accelerated mode, four start memories and four sequence memories are provided.

13 Claims, 8 Drawing Sheets

ACCELERATED MODE TESTER TIMING

This application is a continuation of Ser. No. 08/526,889 filed Sep. 12, 1995, now abandoned.

BACKGROUND OF THE INVENTION

The present invention relates to automatic test equipment for testing circuits, and more particularly, for testing integrated circuits. One such system is described in U.S. Pat. No. 5,212,443 to West et al. for Event Sequencer For Automatic Test Equipment, the disclosure of which is incorporated herein by this reference.

In systems of this kind, at each pin of the device under test (the "DUT" or, simply, the "device"), at any given instant in time, at most one of the following state changes can occur:

Drive to HIGH

Drive to LOW

Drive OFF

Begin Test for HIGH

Begin Test for LOW

Begin Test for Z-State

End Test

Generally, in a system of this kind, memory is provided for storing functional data (also referred to as test vectors). Thus, state changes can be expressed in terms of the state directly, as was done above, or they can express it indirectly with reference to functional data provided by the functional data memory. For example, if n bits of functional data are provided, the universe of event types could include the following event types.

| | |
|---|---|
| D0 | Drive to 0 |
| D1 | Drive to 1 |
| DFn | Drive to n-th bit of functional data |
| DFn_ | Drive to complement of n-th bit of functional data |
| DZ | Turn drive off |
| T0 | Test for a 0 |
| T1 | Test for a 1 |
| TFn | Test for n-th bit of functional data |
| TFn_ | Test for complement of n-th bit of functional data |
| TZ | Test for high impedance |
| X | Turn window strobe off |
| NOP | No operation (dummy event) |

Figure 2A:
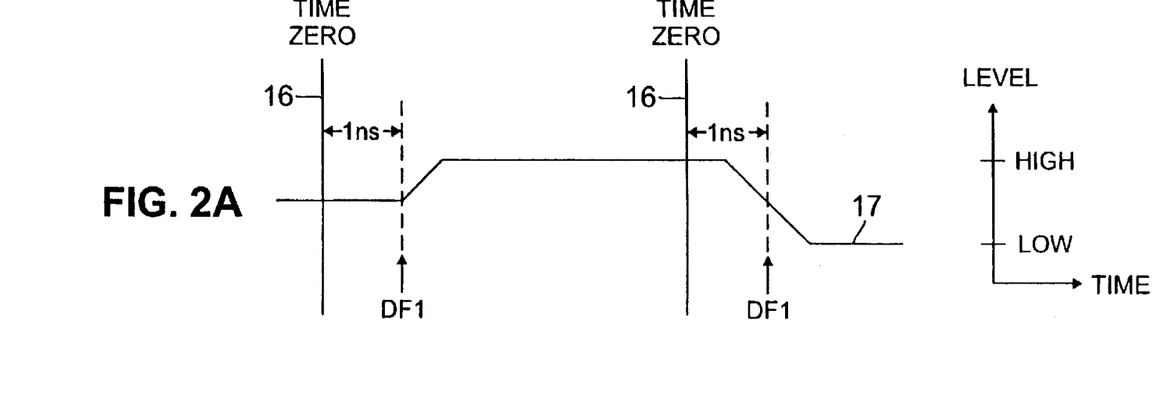
FIGS. 2A–2D illustrate test patterns generated by a test system for various event sequences.

An "event" is a state-time pair, indicating that a transition to a particular state is to be made at a particular time. For example, as illustrated in FIG. 2A, nonreturn to zero (NRZ) format may be specified by programming one event as follows:

DF1@1 ns.

This directs the hardware to drive the pin to the current first bit of functional data at time one nanosecond (1 ns) after the start of the test period, denoted by the test period boundary markers TIME ZERO 16, the time zero for the test period in which the event is performed. FIG. 2A illustrates two events DF1@1 ns in two consecutive event sequences having consecutive period boundary markers TZ 16, as shown: in the first event, F1 is 1, so the signal 17 at the pin goes high; in the second event, F1 is 0, so the signal 17 at the pin goes low.

To accommodate the ever increasing speed of integrated circuit devices, automatic test equipment for testing the devices must achieve increasing speed of operation. The present invention is directed to systems and methods for increasing the frequency with which test periods may be initiated on such equipment.

SUMMARY OF THE INVENTION

In general, in one aspect, the invention features a a test system for testing circuits. The test system has an operating mode including a normal mode and an accelerated mode. The test system has a first start memory, a second start memory, a first sequence memory, and a second sequence memory. The start memories provide sequence memory addresses for addressing the sequence memories, and the sequence memories provide event sequences in response to sequence memory addresses. If the test system is operating in normal mode, the start memories are electronically coupled (switched) to provide a single sequence memory address to both sequence memories; and if the test system is operating in accelerated mode, the start memories are electronically coupled so that the first start memory provides a first sequence memory address to the first sequence memory and the second start memory provides an independent second sequence memory address to the second sequence memory. In embodiments of the invention, the first and second start memories are of the same size, the first and second sequence memories are of the same size, and a word produced by the sequence memories (in response to a sequence memory address) is wide enough to hold at least two events.

In general, in another aspect, the invention features a test system that has a basic test period and that, when run either in normal mode or in accelerated mode, provides some sequence memory address to both the first and the second sequence memory for each basic test period.

In general, in another aspect, the invention features a functional data memory for providing test vectors, which in normal mode provides a full test vector to all event sequences, and in accelerated mode provides a first partial test vector to event sequences from the first sequence memory and a second partial test vector to event sequences from the second sequence memory. In one embodiment, the functional data memory provides a full test vector of at least two bits of functional data and a partial test vector of at least one bit of functional data. In another embodiment, the functional data memory provides a full test vector of at least four bits of functional data and a partial test vector of at least two bits of functional data.

In general, in another aspect, the invention features a test system having a first, second, third and fourth start memory; and a first, second, third, and fourth sequence memory. If the test system is operating in normal mode, the start memories are electronically coupled to provide a single sequence memory address to all four sequence memories; if the test system is operating in accelerated mode, the start memories are electronically coupled so that the first two start memories provides a first sequence memory address to the first two sequence memories, and the second two start memories provide an independent second sequence memory address to the second two sequence memories; and if the test system is operating in double-accelerated mode, the start memories are electronically coupled so that each provides a sequence memory address to the corresponding one of the sequence memories.

Among the advantages of the invention are the following. The invention provides a cost-effective way of providing a useful increase in apparent speed (that is, the number of event-sequences or test vectors that can be initiated in a unit of time) without increasing either the amount of local memory required or the operating speed of the components. The invention provides dynamic compatibility with earlier architecture without reducing the user's flexibility in programming events and test vectors into event sequences.

Other advantages and features will become apparent from the following description and from the claims.

BRIEF DESCRIPTION OF THE DRAWINGS

The accompanying drawings, which are incorporated in, and constitute a part of, the specification, schematically illustrate specific embodiments of the invention and, together with the general description given above and the detailed description of the embodiments given below, serve to explain the principles of the invention.

DETAILED DESCRIPTION

Figure 1A:
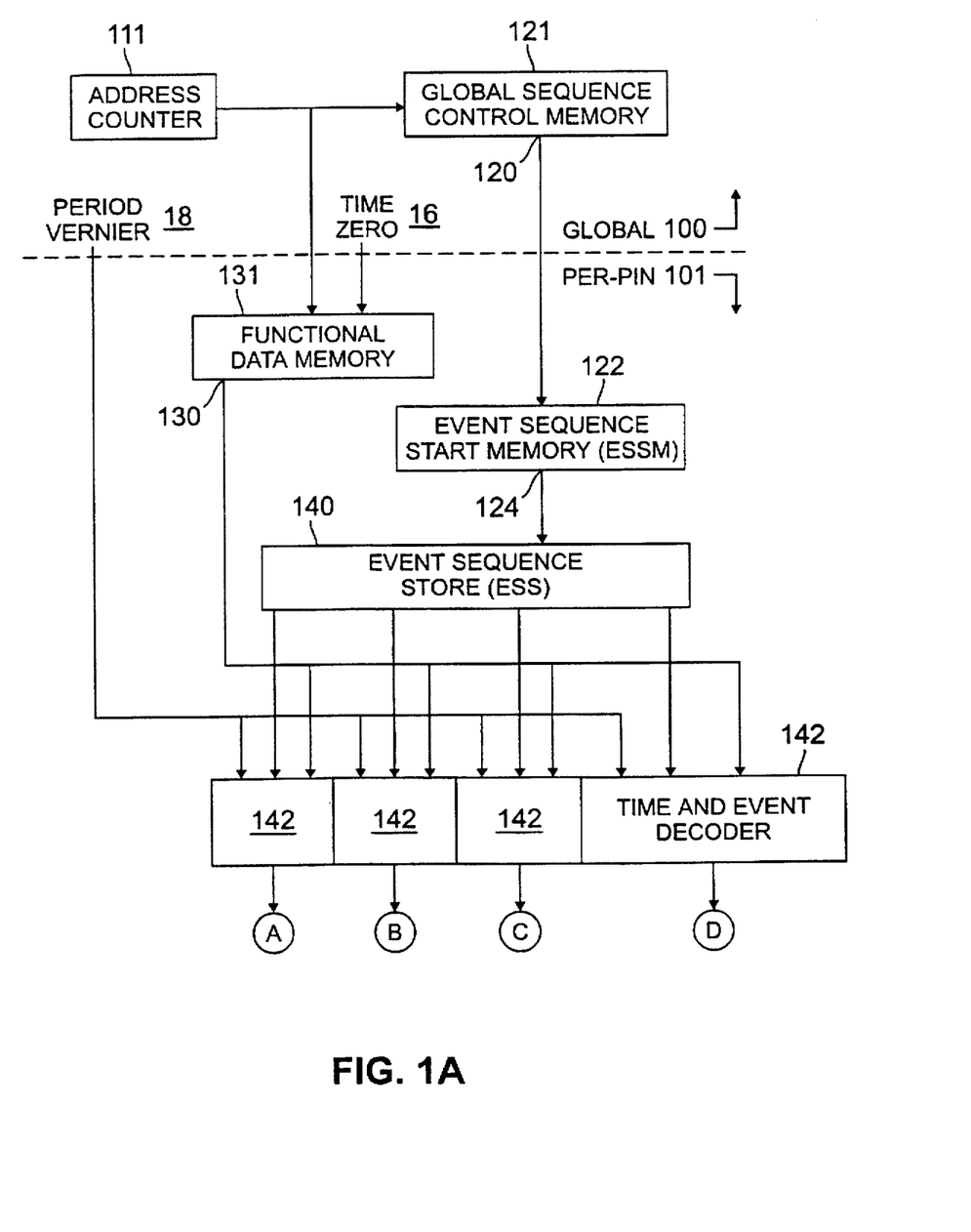
FIGS. 1A and 1B are a block diagram of part of a test system.

Turning to FIG. 1A, an automatic test system for testing integrated electronic circuits has a global section 100 and a per-pin section 101, also known as a local section, which is generally replicated for all pins of the device under test. Global section 100 includes a global address counter 111 that provides global address signals that address global sequence control memory 121 and per-pin functional data memory 131. Global section 100 also provides a test period boundary marker signal TIME ZERO 16 (which is a global time zero clock signal) for marking test period boundaries on the drive side of the DUT. It also provides a test period boundary marker signal STZ (not shown) for marking periods on the strobe (test) side of the DUT, and a global basic clock signal 14 and a global period vernier offset 18, both shown in FIG. 3. Alternatively, a global period vernier address can be provided instead of period vernier offset 18, in which case local section 101 includes a period vernier store (not shown) that provides a period vernier value according to the global period vernier address.

Global sequence control memory 121, in response to global address signals from address counter 111, provides a global sequence address 120 to each local section 101 for each test period. In parallel response to address counter 111, a local functional data memory 131 also provides one or more bits of functional data for each test period.

As will be recalled, an event is a state-time pair indicating that a transition to the given state is to occur at the given time. Turning to FIG. 2A, nonreturn to zero (NRZ) format may be specified by programming one event as follows:

DF1@1 ns.

This directs the hardware to drive the pin to the current first bit of functional data at time one nanosecond (1 ns) after the start of the test period, denoted by the test period boundary markers TIME ZERO 16, the time zero for the test period in which the event is performed. FIG. 2A illustrates two events DF1@1 ns in two consecutive event sequences having consecutive period boundary markers TZ 16, as shown: in the first event, F1 is 1, so the signal 17 goes high; in the second event, F1 is 0, so the signal 17 goes low.

Figure 2B:
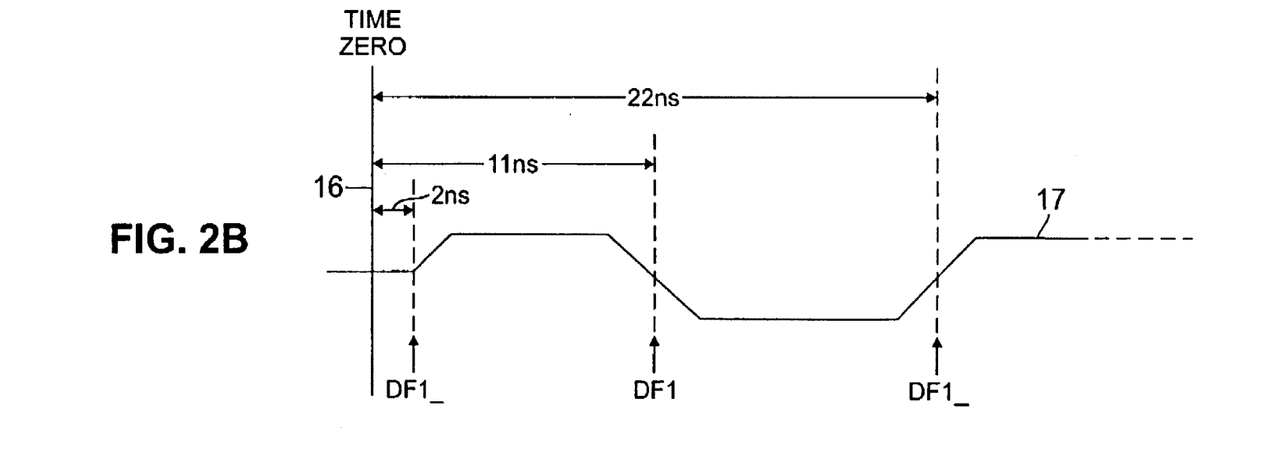

As illustrated in FIG. 2B, surround by complement (SBC) format may be specified by programming the following event sequence.

| | | |
|---|---|---|
| DF1_ | @ | 2 ns |
| DF1 | @ | 11 ns |
| DF1_ | @ | 22 ns |

In FIG. 2B, the signal 17 results from the preceding sequence when the value of F1 is 0 (low).

Figure 2C:
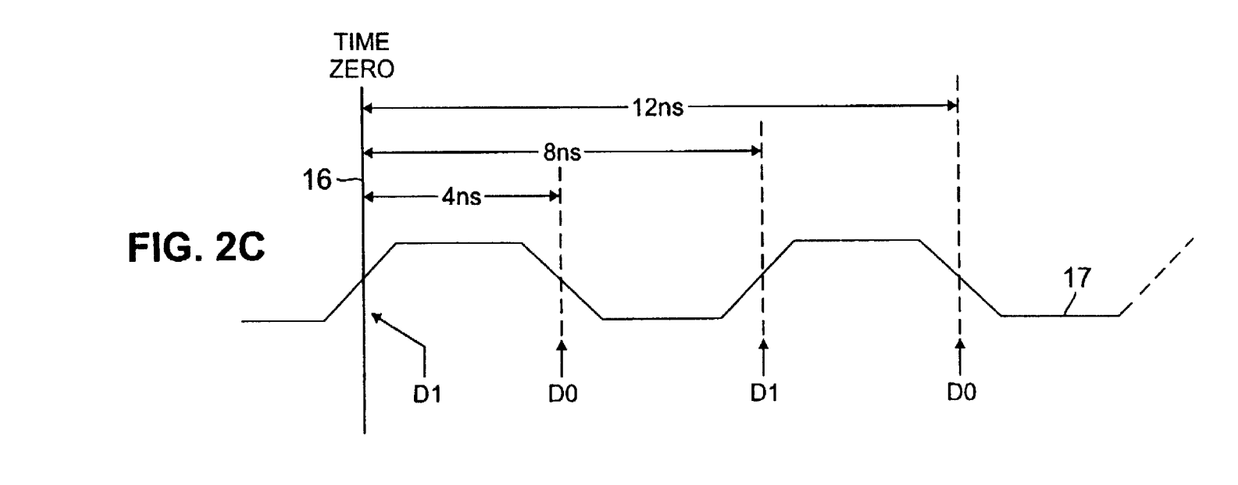

As illustrated in FIG. 2C, a clock pin signal 17 can be generated with no functional data by programming the following event sequence.

| | | |
|---|---|---|
| D1 | @ | 0 ns |
| D0 | @ | 4 ns |
| D1 | @ | 8 ns |
| D0 | @ | 12 ns |

Figure 2D:
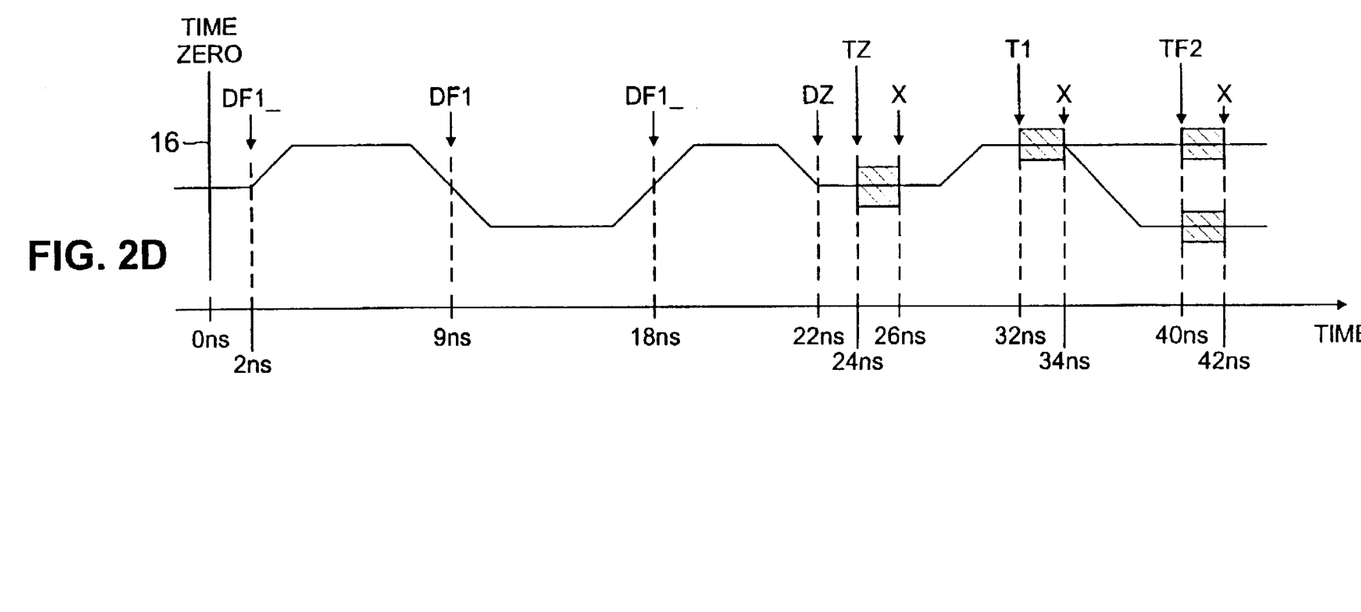

FIG. 2D illustrates a more complex program, showing waveform generation for an I/O cycle with the DUT pin being driven with a surround by complement (SBC) waveform, then the driver being turned off and the output being strobed first for tri-state, then for a 1, and then for one bit of functional data, which may be different from the drive data. This is specified by the following event sequence.

| | | |
|---|---|---|
| DF1_ | @ 2 ns | Drive 1st bit functional data complement |
| DF1 | @ 9 ns | Drive 1st bit functional data |
| DF1_ | @ 18 ns | Drive 1st bit functional data complement |
| DZ | @ 22 ns | Turn drive off |
| TZ | @ 24 ns | Test for tri-state |
| X | @ 26 ns | Turn window strobe off |
| T1 | @ 32 ns | Test for a 1 |
| X | @ 34 ns | Turn window strobe off |
| TF2 | @ 40 ns | Test for 2nd bit functional data |
| X | @ 42 ns | Turn window strobe off |

In FIG. 2D, F1 is 0 (low), and strobe regions are illustrated with cross-hatched boxes. FIG. 2D illustrates both possible values for F2, although there is only one value for any event sequence.

In these examples, functional data memory 131 is understood to deliver at least two bits of functional data for each test period (i.e., for each event sequence). Functional data memory 131 may be embodied to have a width of one bit, two bits, four bits, or any other number of bits. However, for reasons which will appear below, it is preferable that the number of bits be even. In addition, the test system may be operated in a mode in which bits of functional data are used as mask bits rather than as state data. In this mode, a mask bit may indicate, for example, whether or not the tests of the test events (e.g., TZ or T1) in the event sequence are to be performed. If not, they are treated by the system as NOPs.

Figure 3:
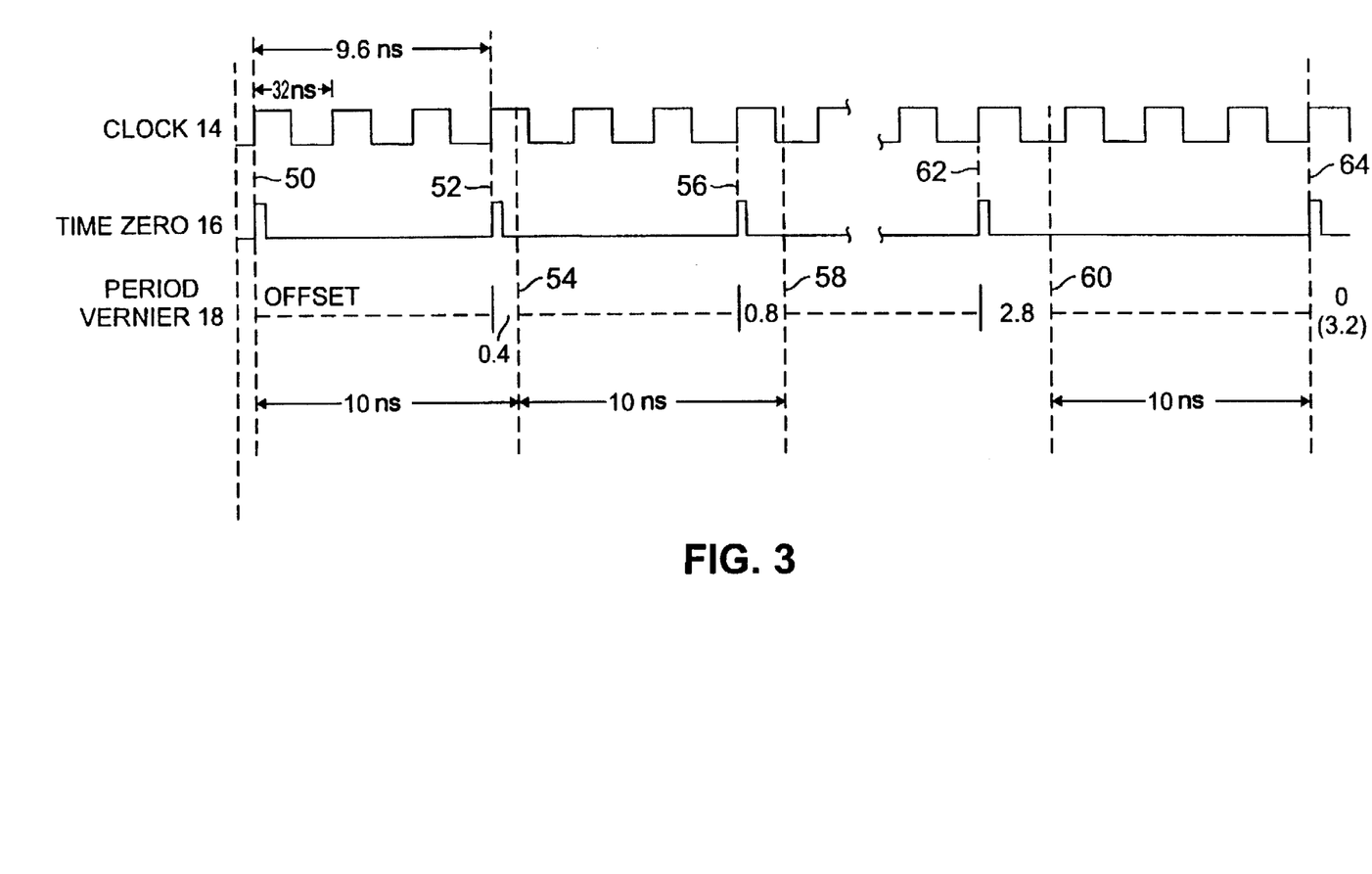
FIG. 3 illustrates clocking signals.

The system may realize a test period that is not an integer multiple of the basic clock period. For purposes of illustration here and elsewhere in this description, and as illustrated in FIG. 3, a clock cycle of 3.2 ns and a test period of 10 ns are used. (Preferred times may be shorter —a basic clock cycle of 2.5 ns and a test period of 5 ns—but the former values are convenient for illustration, and the values selected do not affect the principles of the invention.)

When test period of 10 ns is developed from a basic clock signal 14 having a period of 3.2 ns, it can be seen that 3 basic clock cycles will provide a period of 9.6 ns, while 4 basic clock cycles will provide a period of 12.8 ns. A time zero signal TIME ZERO 16 at time 50 indicates the start of the test period. A second time zero signal TIME ZERO 16 is generated at a time 52, corresponding to a rising edge of clock signal 14 at 9.6 ns. To realize a 10 ns test period, a digital value indicating 0.4 ns is provided as a period vernier offset 18. This offset thus represents a fraction of the basic clock cycle 14. As will be described, the system uses this value to determine the actual start of the next test period at time 54, which is 10 ns from time 50.

Similarly, the next time zero signal TIME ZERO 16 is produced at time 56, requiring a period vernier offset 18 of 0.8 ns to produce the 10 ns period at time 58. This process continues until the offset value becomes 2.8 to produce a test period starting at time 60. Then, on the next period, there are four clock pulses between the time zero signal TIME ZERO 16 at time 62 and the next one at time 64. At this point, no offset value is applied since the beginning of the test period is again aligned with the rising edge of the basic clock pulse.

Thus, test periods of any duration (greater than the basic clock period) may be programmed merely by changing the step size by which the period vernier offset 18 is incremented. (However, other considerations, such as the bandwidth of pipelined memory, may limit the range of test periods that may be selected.)

Returning to FIG. 1A, at the beginning of each test period, local event sequence start memory (ESSM) 122 provides a local event sequence start address 124. Event sequence start address 124 is applied to local event sequence store (ESS) 140 to select an event sequence to be applied to the local device pin, i.e., the pin associated with local section 101. In actual practice, to achieve high data rates, pipelining structures (not shown) are used to pass signals between the illustrated functional blocks.

One event sequence start address 124 selects one word of events from ESS 140. The preferred number of events per word is four, but any of a range of numbers may be used, subject principally to the constraint of cost. An event in ESS 140 carries the following information: the event time, the event type, and an address increment bit, which is used to flag the last event in the event sequence. The application of event sequence start address 124 selects a sequence of events (those stored in ESS 140 beginning at the start address 124) beginning with the first events in the selected word and continuing to the next events in the word (or to events in subsequent words in ESS 140) through the last event of the sequence, the one with an increment bit that is clear. Thus, an ESS 140 having 64 words of 4 events each can store one sequence of up to 256 events or up to 64 sequences of up to 4 events per sequence. Events in an ESS word are passed to time and event decoders 142 for processing—one event per decoder.

An event time is represented as an integer and a fractional number of cycles of basic clock 14. If the fraction is eight bits wide, a time resolution of 1/256th of a basic clock period can be represented. In time and event decoder 142, the event time is added to the period vernier offset 18 to yield the cycle-count-plus-vernier time for the event. The number of time and event decoders 142 preferably matches the number of events in a word in ESS 140.

Time and event decoder 142 also processes the event type, converting it into a "marker type" that defines a complete state transition from the old to the new state. For example, if the event type is DF1, the first bit of the current functional data (i.e., of the current test vector) is "1", and the previous state of the pin driver is LOW, then the marker type will be Drive to HIGH from LOW (expressed in a shorthand notation as "D 1←0"). In converting the event type to a marker type, time and event decoder 142 uses the functional data (which may be mask data) for the test period and the previous state programmed for the pin. The process that loads events in an event sequence into ESS 140 insures that they are in time order, so the previous state derives from the previous effective event. (An event that is, or reduces to, a NOP is not effective to change the state of the pin.) Time and event decoder 142 also takes NOP (no operation) events, events that reduce to NOP events (for example, events that drive the pin to its previous state), and other events that are to be skipped (for example, events in the ESS word following the event flagged as the last event in the sequence), and removes them from the stream of events to be processed.

The following marker types result from the decoding of the event types listed above.

| | |
|---|---|
| D 1<-0 | Drive HI from LOW |
| D 1<-Z | Drive Hi from drive off |
| D 0<-1 | Drive LOW from HI |
| D 0<-Z | Drive LOW from drive off |
| DZ 0 | Drive inhibit from LOW |
| DZ 1 | Drive inhibit from HI |
| T0 | Test for LOW (previous state for a test is always drive inhibit) |
| T1 | Test for HI |
| TZ | Test for tri-state |
| X <- T0 | End test for LOW |
| X <- T1 | End test for HI |
| X <- TZ | End test for tri-state |

Figure 1B:
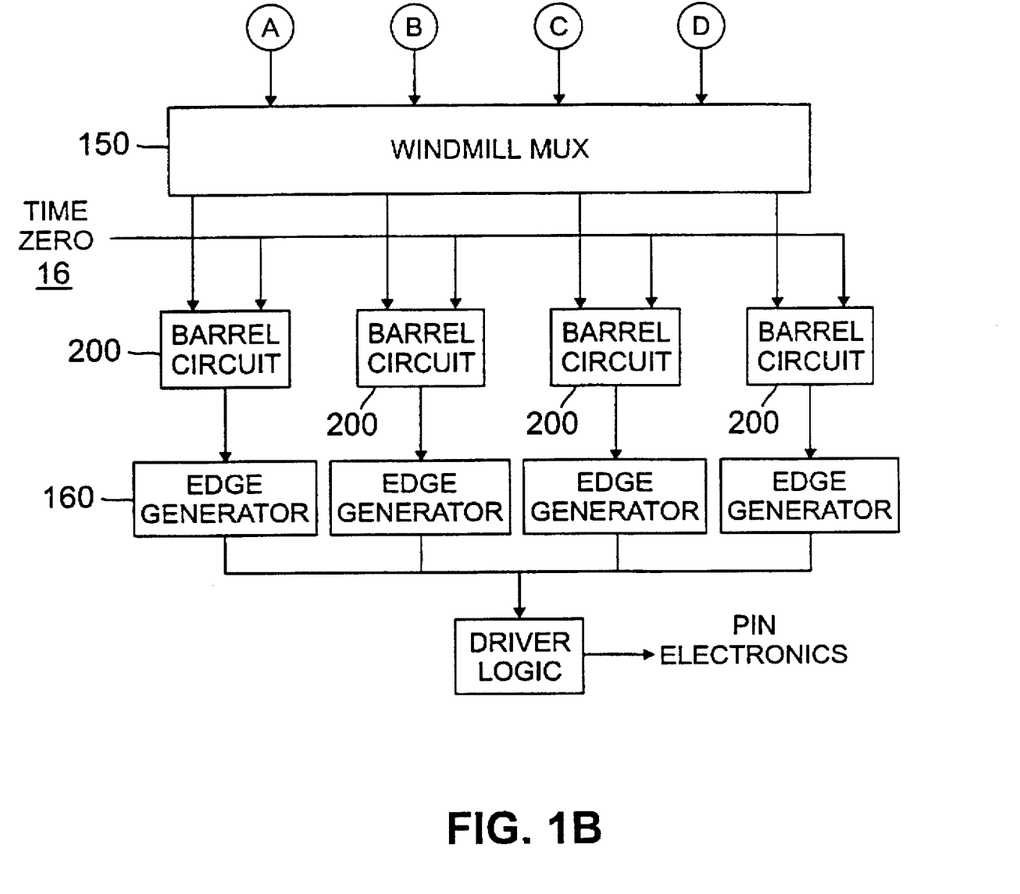

Turning to FIG. 1B, time and event decoders 142 each pass their marker types and cycle-count-plus-vernier times through windmill multiplexer 150 to barrel circuits 200. Windmill multiplexer 150 assigns the decoded events to barrel circuits 200 in round robin fashion, without regard to the word boundaries in event sequence store 140. This is accomplished with two counters. One counter steps through the events in the current word of ESS 140, skipping the NOP events and restarting at the beginning whenever a new word appears. The other counter counts modulo the number of barrel circuits 200 to cycle around the barrel circuits 200. In this way, windmill multiplexer 150 connects the time and event decoder 142 having the next actual event in time sequence to the least recently used barrel circuit 200.

Figure 4:
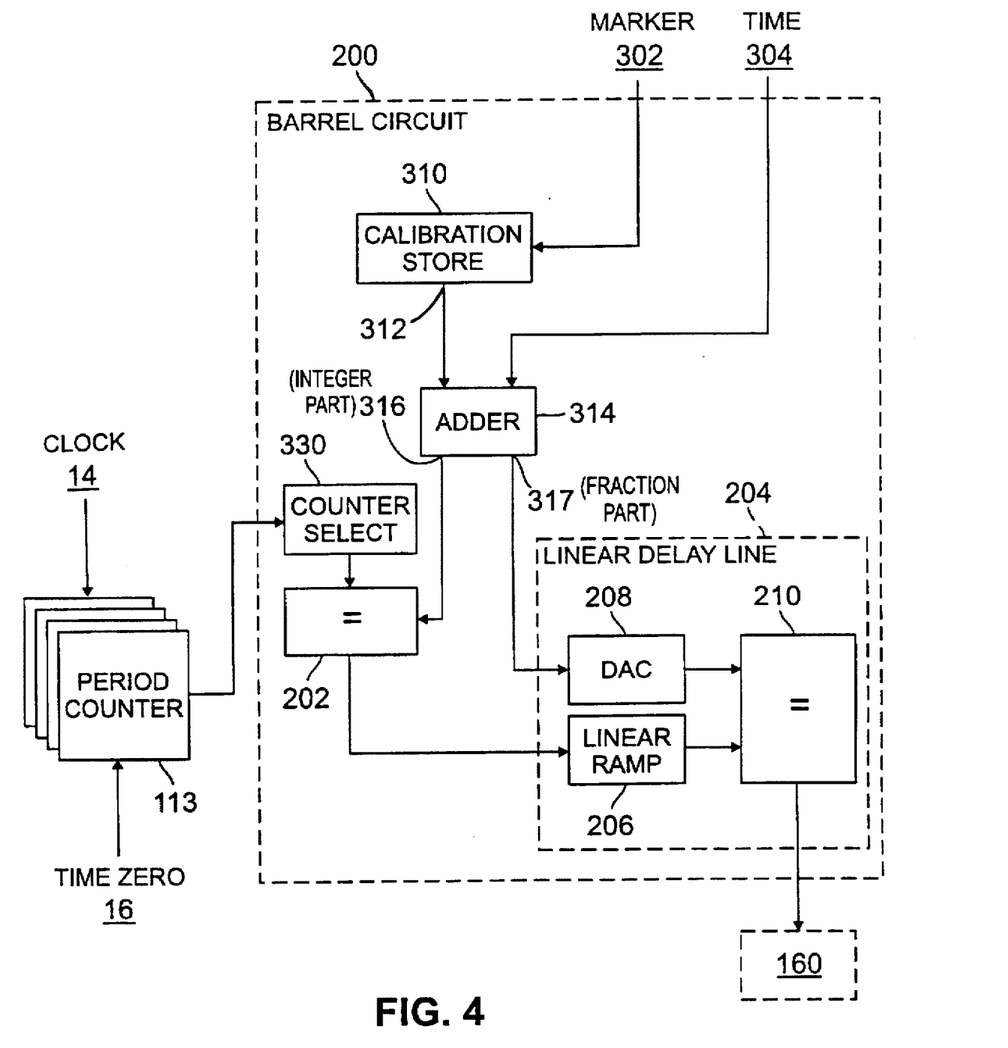
FIG. 4 is a block diagram of a match and linear delay line circuit, also referred to as a barrel circuit.

Turning to FIG. 4, each barrel circuit 200 performs the final time calibration for the marker type 302 and the cycle-count-plus-vernier time 304 received through windmill multiplexer 150. Each barrel circuit 200 has a calibration store 310. Based on the marker type 302, calibration store 310 provides a calibration offset 312, which is added in adder 314 to cycle-count-plus-vernier time 304 to produce a calibrated time for the event. The calibrated time has an integer part 316 and a fraction part 317. With an 8-bit fraction, the calibrated time has a resolution of one part in 256 of the basic clock period. For a basic clock period of 3.2 ns, the resolution would be 12.5 picoseconds (ps).

To achieve the required resolution, a linear delay line is used, as will be described. For delay lines having a retrigger rate of about 10 ns, four delay lines (and hence four barrel circuits 200) are used to allow four events to occur in a 10 ns test period. For a faster overall event rate, either more or faster delay lines are required.

In addition to the event type and event time, an event sequence also has associated with it a period counter number (PCT) (not shown). This allows a strobe (test) event to occur after the end of the event's test period. For example, in an event sequence that requests a response from memory in the DUT, the response (which depends on the speed of the DUT) may occur after the end of the event sequence's period. For that reason, the response will have to be read by a strobe (test) event having a time after the end of the test period of the event sequence. For this reason, period counters 113 are provided, and PCT is incremented modulo the number of period counters at the beginning of each test period (i.e., with each address provided by ESSM 122) to identify the next one of the period counters 113 as the period counter for the test period. To avoid collisions, the number of period counters times the length of a test period should exceed the largest event time in an event sequence.

At the beginning of a test period, the period vernier offset 18 was saved and a new count was started in the test period's period counter 113, which is incremented with every tick of the basic clock 14. Now, in barrel circuit 200, the integer part 316 of the calibrated event time is compared with counter 113 by comparator 202. When they are equal, the fractional part 317 of the calibrated time is realized using a linear delay line 204. Equality at comparator 202 triggers linear ramp 206, which generates a signal rising linearly over its range in the basic clock cycle. The fractional part of the calibrated time is converted to analog form in digital to analog converter (DAC) 208, which is calibrated so that an input to DAC 208 of 255 (assuming an 8-bit fraction) yields an output equal to the output of linear ramp 206 at one basic clock cycle time minus one bit of resolution (12.5 ps) after ramp 206 is triggered. Thus, the output of comparator 210 is an edge at the calibrated event time.

Not shown is the processing of events on the strobe (test) side, where the state of the pin is tested. The logic corresponds to the drive side logic except that a round trip delay time is added in calculating the calibrated time and signal STZ (not shown) is used to define the test period boundary. Separate linear delay lines (not shown) are provided, one in each barrel circuit 200, for timing the strobe events. The round trip delay is implemented in a shift register inserted between comparator 202 and the separate delay line, so that the edge generated at comparator 202 is delayed by a programmable number of clock cycles before it triggers the separate delay line. The round trip delay is generally fixed for a particular test setup to reflect setup-specific factors such as cable lengths. The PCT value for the event sequence and the corresponding period counter 113 are used to associate strobe events with a test period and event.

Accelerated Mode

Figure 5:
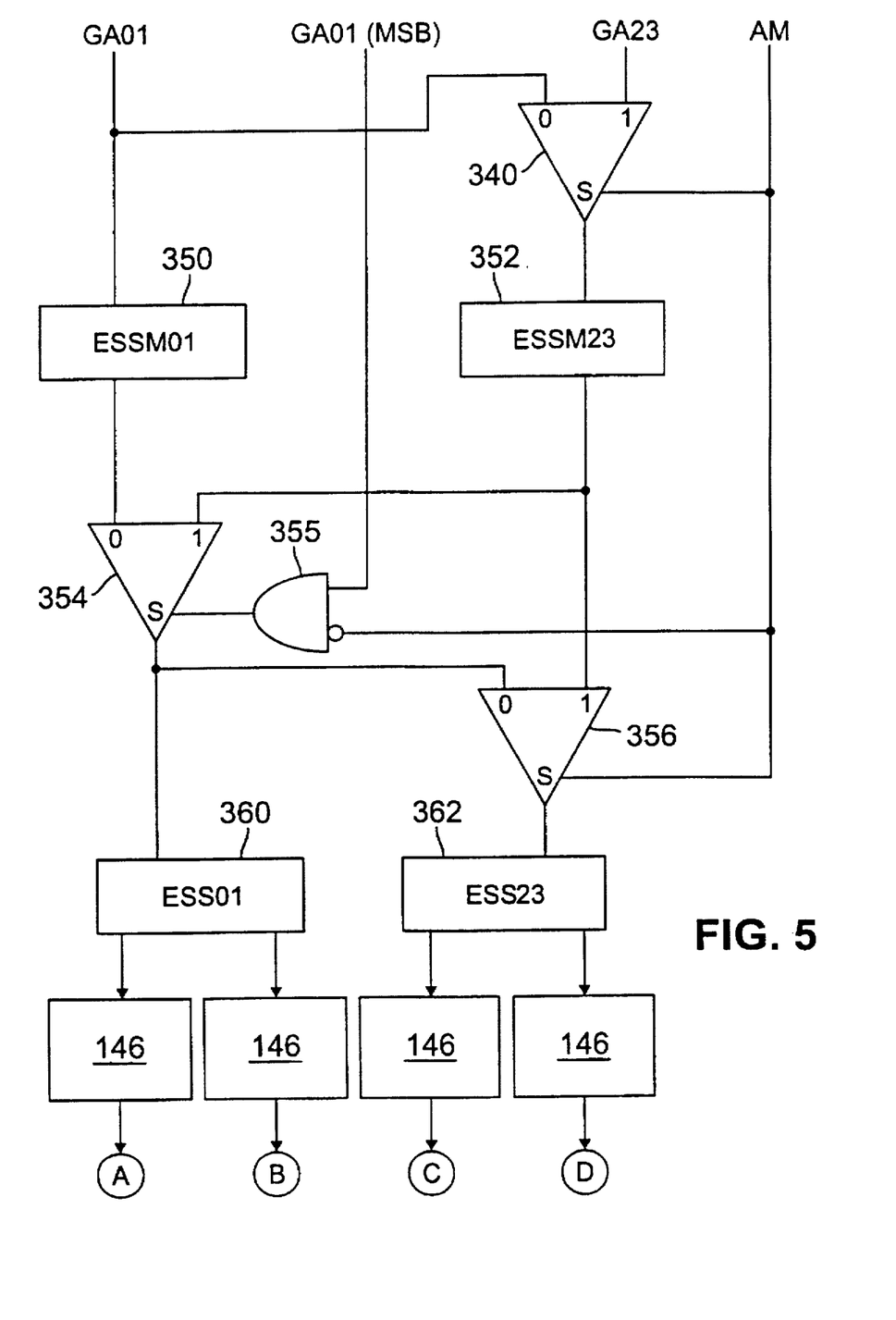
FIG. 5 is a block diagram of memory connected to provide improved tester timing with a normal mode and an accelerated mode.

The architecture just described can be realized as one operating mode (normal mode) of an architecture that, in an accelerated mode, provides double the apparent test rate without increasing the frequency of the basic clock 14 or the speed of the test system components. Turning to FIG. 5, a test system such as has been described is operated in accelerated mode when signal AM=1 and in normal mode when signal AM=0. The addresses and other signals illustrated in FIG. 5 may be transmitted over any kinds of signal paths suitable for the signal bandwidths.

In normal mode, a global address GA01 and a global high order address bit GA01_MSB are presented to event sequence start memories ESSM01 350 and ESSM23 352. With AM=0, selector 340 passes address GA01 (the selector's 0 input) through to ESSM23. Thus, the same global address GA01 is presented to both ESSM01 and ESSM23, and the output of one or the other is used, depending on the value of the high order address bit GA01_MSB. In normal mode, output of gate 355 is GA01_MSB. If GA01_MSB is 0, the output of gate 355 is 0 and selector 354 passes its 0 input, the start address from ESSM01, through to event sequence store ESS01 and, through selector 356, to event sequence store ESS23. (The event sequence stores are designated ESS01 and ESS23 because, when used together as one memory in normal mode, they carry event sequence start addresses for what would be events 0 and 1 (ESS01 360) and events 2 and 3 (ESS23 362), respectively, corresponding to a four-event word ESS 140. The designations ESSM01 and ESSM23 are chosen for the same reason.)

If GA01_MSB is 1 in normal mode, the output of gate 355 is 1 and it is the start address from ESSM23 that is presented to both ESS01 and ESS23. In either case, if AM=0 the global address formed by the combined GA01 and GA01_MSB selects a start address presented to both event sequence stores ESS01 and ESS23, which then each provide two events, one to each of a pair of time and event decoders 142. Thus, when AM=0, the test system operates as has previously been described.

On the other hand, in accelerated mode, when AM=1, the start address produced by ESSM01 is selected by GA01, the start address produced by ESSM23 is selected by GA23, and GA01_MSB has no effect because the output of gate 355 in accelerated mode is always 0. Thus, ESS01 and ESS23 are given two different addresses and twice as many test periods can be started in a given time frame as could be started with AM=0.

As is apparent from FIG. 5, GA01_MSB and GA23 will never both be active. In accelerated mode, GA23 is used but not GA01_MSB; in normal mode, GA01_MSB is used, but not GA23. Thus, to minimize the width of the data path required to provide global addresses to the per-pin section 101, one of the bits of GA23 may do double duty to provide GA01_MSB in normal mode.

As has been mentioned, each event carries an address increment bit, which is used to flag the last event that terminates an event sequence. In accelerated mode, the event sequences of ESS01 and ESS23 are terminated separately, there being no requirement that event sequences sharing a major period be of the same length. In normal mode, on the other hand, an event sequence may be terminated in either ESS01 or ESS23, and that termination invokes the beginning of the next event sequence.

To allow for reconfiguration where the entire event sequence start memory (ESSM01 and ESSM23) is used whether or not accelerated mode is selected, the global sequence control memory 121 is expanded in width to provide twice the number of addresses, so that all locations in both ESSM01 and ESSM23 can be addressed separately.

The times calculated in barrel circuits 200, and hence the event times of events stored in ESS 140 (or in ESS01 and ESS23 in accelerated mode) are all calculated (and hence, defined) in reference to signal TIME ZERO 16 (or signal STZ for strobe events), which defines what is called the major period. One could implement a boundary marker signal for half major periods to serve as a time reference for events in ESS23 in accelerated mode. However, this is not necessary. Instead, the test compilation process (a computer program) that translates a test program as expressed by a test engineer into instructions for the test system, when the test engineer calls for a test run in accelerated mode, takes the event sequences stored in the odd event sequence store (ESS23) and increments their event times by one-half a major period. Thus, a test engineer can easily program event sequences with a test period frequency twice as fast as the actual TIME ZERO frequency.

In normal mode, with a functional memory providing four bits of functional data for each test period, the bits making up a full test vector are all provided to each time and event decoder 142. In accelerated mode, the event sequences from ESS01 are independent of those from ESS23, and logically the test vectors for these event sequences are also independent. To provide independent test vectors in accelerated mode, functional data memory 131 could be split in the same way ESSM 122 and ESS 140 were split, to provide independent, shorter test vectors (partial test vectors) in accelerated mode. (Recall that two bits of functional data in a two-bit partial test vector are sufficient to program the sequence illustrated in FIG. 2D.) However, the same effect can be achieved programmatically in the test program compilation process. When, for example, the test engineer programs a test for accelerated mode with event sequences having two data bits per event sequence, all event sequences in the engineer's program would refer solely to F1 and F2 (in the notation adopted above). When translated for operation in the test system, the event sequences allocated to the odd event sequence store (ESS23) are modified to refer to F3 and F4, respectively, the data is so loaded in functional data memory 131, and functional data memory 131 is configured to provide four bits of data for each test period. In this way, no modification to barrel circuits 200 or to functional data memory 131 is required to support accelerated mode.

Using techniques that have been described, the event sequence start memories, the event sequence stores, and the output of the functional data memory can again be divided, and the width of the global sequence control memory can again be increased, to provide four times the event period frequency with one-fourth the functional data per event sequence. This four-way increase in the test period frequency may be referred to as double-accelerated mode.

Figure 6:
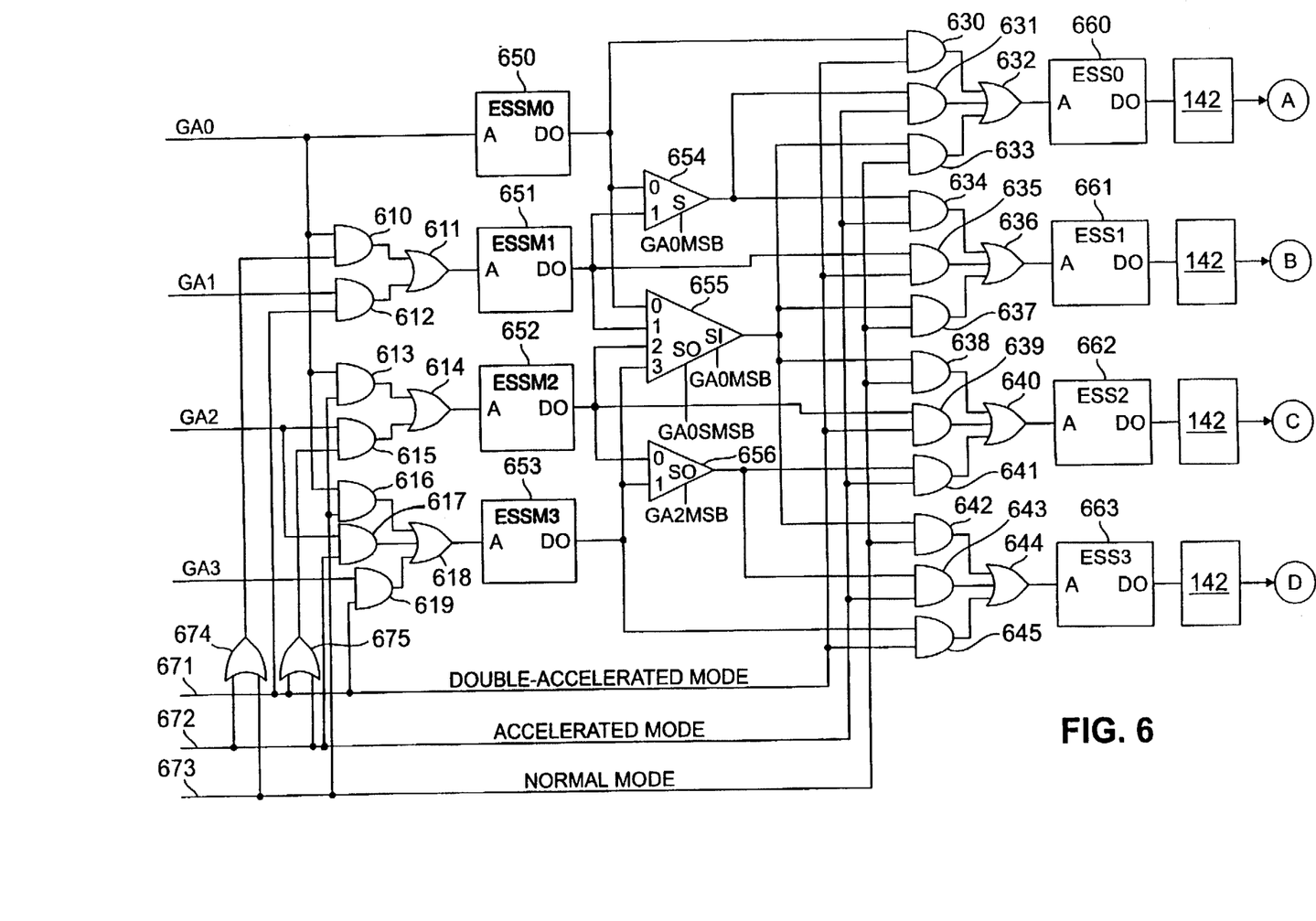
FIG. 6 is a block diagram of memory connected to provide improved tester timing with a normal mode, an accelerated mode, and a double-accelerated mode.

Turning to FIG. 6, a test system such as has been described is operated in double-accelerated mode when signal 671 is 1, in accelerated mode when signal 672 is 1, and in normal mode when signal 673 is 1. Only one of the signals 671, 672, and 673 will be 1 at any one time. The output of OR gate 674 is 1 if the test system is in either normal or accelerated mode. The output of OR gate 675 is 1 if the test system is in either accelerated or double-accelerated mode. Address paths GA0, GA1, GA2, and GA3 provide addresses from the global section 100. For the sake of illustration, each of these four paths will be taken as providing 10 bits. Also, as is conventional, the terms GA0, GA1, GA2, and GA3 may also be used to refer to the addresses on the address paths, since the meaning will be clear from the context.

In double-accelerated mode, each of the four event sequence start memories—ESSM0 650, ESSM1 651, ESSM2 652 and ESSM3 653—will be addressed by an independent 10 bit (for example) address, and thus GA0, GA1, GA2, and GA3 must each provide a 10 bit address to address the 1K words (an illustrative value corresponding to the size of the addresses) in each of the memories ESSM0, ESSM1, ESSM2, and ESSM3.

In accelerated mode, the four event sequence start memories operate in pairs—ESSM0 with ESSM1 and ESSM2 with ESSM3. Thus, with 1K memories, two independent 11 bits addresses are required. As illustrated in FIG. 6, these two addresses are provided by GA0 and GA2, which each provide 10 bits, and two bits that may be taken from any of the 20 bits in GA1 and GA3 provide each address an eleventh bit. To indicate their role in accelerated mode, namely, to function as the high order bits of GA0 and GA2, these two bits are denoted GA0MSB and GA2MSB.

In normal mode, the four event sequence start memories—ESSM0, ESSM1, ESSM2, and ESSM3—operate as one memory. Thus, with 1K memories, one 12 bit address is required. As illustrated in FIG. 6, 10 bits of the 12 bit address are provided by GA0 and the other two bits may be taken from any of the 30 bits in GA1, GA2, and GA3. These two bits are denoted GA0MSB and GA0SMSB, indicating that they serve as the most significant and second most significant bits of the address. (Note that the address bit used as GA0MSB in accelerated mode conveniently may be, but need not be, the same bit as is used as GA0MSB in normal mode.)

In normal mode, addresses GA0 are gated through AND gates 610, 613, and 616 and then through OR gates 611, 614, and 618, while addresses GA1, GA2, and GA3 are blocked by AND gates 612, 615, 617, and 619. Thus, the same address is presented in normal mode to each of the four memories ESSM0 650, ESSM1 651, ESSM2 652, and ESSM3 653. The output of exactly one of these four memories is provided as the address to event sequence stores ESS0 660, ESS1 661, ESS2 662, and ESS3 663 by operation of selector 655. Selector 655 selects one of its four inputs (ESSM0, ESSM1, ESSM2, AND ESSM3) according to the state of the two bits GA0MSB and GA0SMSB, which operate as the high order bits of the 12 bit address presented to the event sequence start memories. The output of selector 655 is gated through to the four event sequence stores by AND gates 633, 637, 638, and 642 and then through OR gates 632, 636, 640, and 644, while the other paths to the four event sequence stores are blocked by AND gates 630, 631, 634, 635, 639, 641, 643, and 645. Thus, in normal mode, the same address is presented to each of the four event sequence stores ESS0 660, ESS1 661, ESS2 662, and ESS3 663.

In accelerated mode, addresses GA0 are gated through AND gate 610 and then through OR gate 611, and addresses GA2 are gated through AND gates 615 and 617 and then through OR gate 618, while addresses GA1 and GA3 are blocked by AND gates 612 and 619. Thus, in accelerated mode, GA0 is presented to each of the memories ESSM0 650 and ESSM1 651 and GA2 is presented to each of the memories ESSM2 652 and ESSM3 653. The output of exactly one of ESSM0 and ESSM1 is provided as the address to event sequence stores ESS0 660 and ESS1 661 by operation of selector 654. Similarly, the output of exactly one of ESSM2 and ESSM3 is provided as the address to event sequence stores ESS2 and ESS3 by operation of selector 656. Selector 654 selects one of its two inputs (ESSM0 or ESSM1) according to the state of bit GA0MSB, which operates as the high order bit of the 11 bit address presented to the event sequence start memories ESS0 and ESS1. Similarly, selector 656 selects one of its two inputs (ESSM2 or ESSM3) according to the state of bit GA2MSB, which operates as the high order bit of the 11 bit address presented to the event sequence start memories ESS2 and ESS3. The output of selectors 654 and 656 are gated through to the four event sequence stores by AND gates 631, 634, 641, and 643 and then through OR gates 632, 636, 640, and 644, while the other paths to the four event sequence stores are blocked by AND gates 630, 633, 635, 637, 638, 639, 642, and 645. Thus, in accelerated mode, one address is presented to each of the pair of event sequence stores ESS0 660 and ESS1 661, and an independent address is presented to each of the pair of event sequence stores ESS2 662 and ESS3 663.

In double-accelerated mode, addresses GA0 are provided directly to ESSM0 650 (as they are in the two other modes), addresses GA1 are gated through AND gate 612 and then through OR gate 611 to ESSM1 651, and addresses GA2 are gated through AND gate 615 and then through OR gate 614 to ESSM2 652, and addresses GA3 are gates through AND gate 619 and then through OR gate 618 to ESSM3 653, while other addresses are blocked from other events sequences start memories by AND gates 610, 613, 616 and 617. Thus, in double-accelerated mode, GA0 is presented only to ESSM0 650, GA2 is presented only to ESSM1 651, GA1 is presented only to ESSM2 652, and GA3 is presented only to ESSM3 653. Similarly, by AND gates 630, 635, 639, and 645, respectively, the output of ESSM0 is presented only to ESS0 660, the output of ESSM1 is presented only to ESS1 661, the output of ESSM2 is presented only to ESS2 662, and the output of ESSM3 is presented only to ESS3 663. The other circuit paths, which run through selectors 654, 655, and 656, are all blocked by AND gates 631, 633, 634, 637, 638, 641, 642, and 643. Thus, in double-accelerated mode, independent addresses are presented to each of the event sequence stores ESS0 660, ESS1 661, ESS2 662, and ESS3 663.

It will be understood that the addresses and other signals illustrated in FIG. 6 may be transmitted over any kinds of signal paths suitable for the signal bandwidths.

Also, it should be noted that the memories in the per-pin section 101 need not be of the same size or that they be split into an even number of parts or parts of equal size.

By use of accelerated mode, the apparent speed of the test system (number of event-sequences that can be initiated in a unit of time) is doubled while maintaining compatibility with earlier architecture and without increasing either the amount of local memory required or the operating speed of the components, and without reducing the user's flexibility in combining events and functional data into event sequences. Rather than being limited to initiating one event sequence every 10 ns, for example, the user can initiate two event sequences in that time, with separate global sequence addresses GA01 and GA23 and separate functional data. The cost of this increase in test cycle speed is that a single-period event sequence may include no more than the number of events stored in each word of ESS01 or ESS23, rather than the number events stored in each word of ESS 140.

The present invention has been described in terms of specific embodiments. The invention, however, is not limited to the embodiments depicted and described. For example, the invention may be embodied in architectures that do not divide physical resources into a global section and a local section, that provide the functions of global addresses with locally replicated address resources, or that provide local memory functions in memory resources from a global or commonly-allocated memory. Rather, the scope of the invention is defined by the appended claims.

What is claimed is:

1. A test system providing an event sequence for testing a circuit comprising:

a first start memory and a second start memory that each output a sequence memory address in response to a global address input;

a first sequence memory and a second sequence memory that each output events in response to a sequence memory address;

a terminal carrying a mode signal indicating whether a current mode of operation is a normal mode or an accelerated mode; and a selector circuit, connected to the terminal and responsive to the mode signal, selecting from connections between the first and second start memories and the first and second event sequence memories, the connections formed so that (i) a same sequence memory address is presented to both the first and second event sequence memories in normal mode, and (ii) a first sequence memory address from the first start memory is presented to the first event sequence memory while a separate second sequence memory address from the second start memory is presented to the second event sequence memory in accelerated mode.

2. The test system of claim 1 wherein the first start memory and the second start memory are of the same size.

3. The test system of claim 1 wherein the first event sequence memory and the second event sequence memory are of the same size.

4. The test system of claim 3 wherein the first event sequence memory produces a word that is wide enough to hold at least two events.

5. The test system of claim 4 wherein the test system operates on a basic test period and wherein during a test run in both the normal mode and the accelerated mode, for each basic test period, some sequence memory address is provided to both the first event sequence memory and the second event sequence memory.

6. The test system of claim 5 further comprising a functional data memory, having memory locations storing test vectors, wherein the functional data memory provides, for each basic test period, at least two bits of functional data in a full test vector in the normal mode.

7. The test system of claim 6 wherein the functional data memory provides, for each basic test period, at least four bits of functional data in a full test vector in the normal mode.

8. A test system, for providing an event sequence for testing a circuit, comprising:

a first start memory, a second start memory, a third start memory, and a fourth start memory, each of which output sequence memory addresses;

a first event sequence memory, a second event sequence memory, a third event sequence memory, and a fourth event sequence memory, each of which output events in response to a sequence memory address;

a signal path carrying a mode signal indicating an operating mode of the test system; and a selector circuit, connected to the signal path and responsive to the mode signal, selecting from connections between the first, second, third, and fourth start memories and the first, second, third, and fourth event sequence memories, the connections formed so that (i) a single sequence memory address from the first, second, third, and fourth start memories is presented to The first, second, third, and fourth event sequence memories in a normal mode, (ii) a first sequence memory address from the first and second start memories is presented to the first and second event sequence memories, and an independent second sequence memory address from the third and fourth start memories is presented to the third and fourth event sequence memories in an accelerated mode, and (iii) a first sequence memory address from the first start memory is presented to the first event sequence memory, an independent second sequence memory address from the second start memory is presented to the second event sequence memory, an independent third sequence memory address from the third start memory is presented to the third event sequence memory, and an independent fourth sequence memory address from the fourth start memory is presented to the fourth event sequence memory in a doubler-accelerated mode.

9. The test system of claim 8 further comprising a functional data memory, having memory locations storing test vectors, wherein the functional data memory provides, for each basic test period, at least two bits of functional data in a full test vector in the normal mode.

10. A method for providing an event sequence for testing a circuit, comprising:

receiving a selection of a mode of operation;

receiving a global address in a test period;

producing as output a single start address if the selection is normal mode, and producing as output first and second start addresses if the selection is accelerated mode;

receiving the output in an event sequence memory storing event sequences, the event sequence memory comprising a first event sequence store and a second event sequence store; and applying the single start address to both the first and the second event sequence stores in normal mode, and applying the first start address to the first event sequence store and the second start address to the second event sequence store in accelerated mode.

11. A method providing start addresses in a circuit tester, comprising:

receiving a selection of a mode of operation;

receiving global address input on a set of global address lines; and reacting to the selection to receive the global address data on a proper subset of the global address lines to select and output a single start address if the selection is normal mode, and to receive the global address data on the entire set of global address lines to select and output a first and a second start address if the selection is accelerated mode.

12. A method increasing frequency of initiation of event sequences in a test system that provides event sequences for testing a circuit, comprising:

receiving a selection of a mode of operation;

receiving a start address input;

storing event sequences in an event sequence memory; and reacting to the selection and the start address input to produce as output one event sequence from the event sequence memory if the selection is normal mode and two event sequences from the event sequence memory if the selection is accelerated mode.

13. Apparatus providing event sequences in a test system for testing a circuit, comprising:

a terminal carrying a mode signal indicating whether a current mode of operation is a normal mode or an accelerated mode;

first address input lines and second address input lines;

a multiplexer circuit, connected to the terminal and to the first and second address input lines and responsive to the mode signal, the multiplexer circuit operating to gate data on the first address input lines to the second address input lines in the normal mode and to isolate the first address input lines from the second address input lines in the accelerated mode; and an event sequence memory, having memory locations for storing events, the event sequence memory outputting event sequences in response to address data on the first address input lines and the second address input lines.

* * * * *